(12) United States Patent
Saito et al.

(10) Patent No.: US 12,179,291 B2
(45) Date of Patent: Dec. 31, 2024

(54) METHOD FOR STEP-SOLDERING

(71) Applicant: SENJU METAL INDUSTRY CO., LTD., Tokyo (JP)

(72) Inventors: Takashi Saito, Tokyo (JP); Shunsaku Yoshikawa, Tokyo (JP); Naoko Izumita, Tokyo (JP)

(73) Assignee: SENJU METAL INDUSTRY CO., LTD., Tokyo (JP)

( * ) Notice: Subject to any disclaimer, the term of this patent is extended or adjusted under 35 U.S.C. 154(b) by 0 days.

(21) Appl. No.: 18/126,695

(22) Filed: Mar. 27, 2023

(65) Prior Publication Data

US 2023/0226648 A1 Jul. 20, 2023

Related U.S. Application Data

(63) Continuation of application No. 17/417,205, filed as application No. PCT/JP2020/018837 on May 11, 2020, now abandoned.

(30) Foreign Application Priority Data

May 27, 2019 (JP) ................................. 2019-098427

(51) Int. Cl.
*B23K 35/26* (2006.01)
*C22C 13/00* (2006.01)
(Continued)

(52) U.S. Cl.
CPC ............ *B23K 35/262* (2013.01); *C22C 13/00* (2013.01); *H05K 1/0298* (2013.01); *H05K 3/3457* (2013.01); *B23K 2101/42* (2018.08)

(58) Field of Classification Search
None
See application file for complete search history.

(56) References Cited

U.S. PATENT DOCUMENTS

| | | |
|---|---|---|
| 5,256,370 A | 10/1993 | Slattery et al. |
| 2003/0015575 A1 | 1/2003 | Yamaguchi et al. |
| | (Continued) | |

FOREIGN PATENT DOCUMENTS

| | | |
|---|---|---|
| CN | 103341699 A | 10/2013 |
| CN | 104870673 A | 8/2015 |
| | (Continued) | |

OTHER PUBLICATIONS

Machine translation of CN103341699A. (Year: 2013).*

(Continued)

*Primary Examiner* — Xiaowei Su
(74) *Attorney, Agent, or Firm* — Myers Wolin, LLC

(57) ABSTRACT

A method for step-soldering includes applying a first solder alloy having a melting point in a temperature range from 160 to 210° C. to a jointed portion of a first electronic component and a substrate, and heating them in the temperature range from 160 to 210° C., and applying a second solder alloy having the melting point in a temperature range lower than 160° C. to a joint portion of a second electronic component and the substrate, and heating them in the temperature range lower than 160° C. The first solder alloy consists of 13-22 mass % of In, 0.5-2.8 mass % of Ag, 0.5-5.0 mass % of Bi, 0.002-0.05 mass % of Ni and a balance Sn.

9 Claims, 9 Drawing Sheets

(51) Int. Cl.
  *H05K 1/02* (2006.01)
  *H05K 3/34* (2006.01)
  *B23K 101/42* (2006.01)

(56) References Cited

U.S. PATENT DOCUMENTS

| | | | |
|---|---|---|---|
| 2010/0053924 | A1 | 3/2010 | Ueshima |
| 2010/0307823 | A1 | 12/2010 | Kawamata et al. |
| 2014/0112710 | A1 | 4/2014 | Albrecht et al. |
| 2015/0328722 | A1 | 12/2015 | Suzuki et al. |
| 2020/0373277 | A1* | 11/2020 | Kosuga .................. H01L 24/81 |

FOREIGN PATENT DOCUMENTS

| | | |
|---|---|---|
| JP | H6-15476 A | 1/1994 |
| JP | 2004-188453 A | 7/2004 |
| JP | 2007-105750 A | 4/2007 |
| JP | 2013-198937 A | 10/2013 |
| WO | 2007/021326 A2 | 2/2007 |
| WO | 2008/111615 A1 | 9/2008 |
| WO | 2009/011392 A1 | 1/2009 |
| WO | 2012/115268 A1 | 8/2012 |
| WO | 2014/097390 A1 | 6/2014 |

OTHER PUBLICATIONS

Decision to Grant a Patent issued by the Japan Patent Office for corresponding Japanese Patent Application No. 2019-098427, mailed on Apr. 21, 2020, with an English translation.
Notice of Reasons for Refusal issued by the Japan Patent Office for corresponding Japanese Patent Application No. 2019-098427, mailed on Dec. 3, 2019, with an English translation.
International Search Report and Written Opinion of the International Searching Authority issued by the Japan Patent Office for corresponding International Patent Application No. PCT/JP2020/018837, mailed on Aug. 4, 2020, with a partial English translation.
Examination Report issued by the Patent Office of India for corresponding Indian Patent Application No. 202147026828, electronically delivered on Jul. 19, 2021, with an English translation.
First Office Action issued by The State Intellectual Property Office of People's Republic of China for corresponding Chinese Patent Application No. 202080027863.1, dated Jan. 26, 2022, with an English translation.
Second Examination Opinion Notice issued by the China National Intellectual Property Administration for corresponding Chinese Patent Application No. 202080027863.1, dated May 11, 2022, with an English machine translation.
Extended European search report with the Supplementary European search report and the European search opinion issued by the European Patent Office for corresponding European Patent Application No. 20815157.1-1103, dated Aug. 19, 2022.
Notice of the Result of Substantive Examination pursuant to Article 62 Paragraph (1) of Indonesian Patent Law No. 13/2016, issued by the Ministry of Law and Human Rights of The Republic of Indonesia Directorate General Of Intellectual Property for corresponding Indonesian Patent Application No. P00202110610, dated Jan. 17, 2023, with an English translation.
Invitation to Respond to Written Opinion issued by the Intellectual Property Office of Singapore for corresponding Singapore Patent Application No. 11202107118Q, dated Jan. 16, 2023.
Office Action / Restriction Requirement issued by the United States Patent and Trademark Office for corresponding U.S. Appl. No. 17/417,205, electronically delivered on Dec. 13, 2021.
Non-Final Office Action issued by the United States Patent and Trademark Office for corresponding U.S. Appl. No. 17/417,205, electronically delivered on Jan. 27, 2022.
Final Office Action issued by the United States Patent and Trademark Office for corresponding U.S. Appl. No. 17/417,205, electronically delivered on Apr. 29, 2022.
Non-Final Office Action issued by the United States Patent and Trademark Office for corresponding U.S. Appl. No. 17/417,205, electronically delivered on Nov. 25, 2022.
Non-Final Office Action issued by the United States Patent and Trademark Office for corresponding U.S. Appl. No. 17/417,205, electronically delivered on Oct. 18, 2023.
Communication pursuant to Article 94(3) EPC issued by the European Patent Office for corrresponding European Patent Application No. 20 815 157.1, dated Mar. 25, 2024.
Communication pursuant to Article 94(3) EPC issued by the European Patent Office for corrresponding European Patent Application No. 20 815 157.1, dated Aug. 28, 2024.

* cited by examiner

Ref.2:Sn-15.0In-2.5Ag-2.0Bi        Ex.2:Sn-15.0In-2.5Ag-2.0Bi-0.02Ni

Ref.4:Sn-17In-2.5Ag-1.5Bi        Ex.3:Sn-17In-2.5Ag-1.5Bi-0.02Ni

Ref.2:Sn-15.0In-2.5Ag-2.0Bi    Ex.2:Sn-15.0In-2.5Ag-2.0Bi-0.02Ni

Ref.4:Sn-17In-2.5Ag-1.5Bi    Ex.3:Sn-17In-2.5Ag-1.5Bi-0.02Ni

METHOD FOR STEP-SOLDERING

CROSS-REFERENCE TO RELATED APPLICATIONS

This application is a continuation application under 35 U.S.C. 111 (a) of U.S. application Ser. No. 17/417,205, filed on Jun. 22, 2021, which is a national stage application under 35 U.S.C. 371 of International Application No. PCT/JP2020/018837, filed on May 11, 2020 and designated the U.S., which claims priority to Japanese Patent Application No. 2019-098427, filed on May 27, 2019. The contents of each are herein incorporated by reference.

TECHNICAL FIELD

The present disclosure relates to a method for step-soldering.

BACKGROUND

In recent years, lead-free soldering alloy that does not contain lead has been used in consideration of environment. Examples of the lead-free soldering alloy include SAC305 (Sn-3.0Ag-0.5Cu). A melting point of SAC305 is about 220° C. During a soldering with SAC305, a peak temperature of a reflow oven is generally set to an intermediate temperature range of about 250° C.

On the other hand, in order to suppress thermal loads on a miniaturized electronic part, the soldering performed in a low temperature range has also been required. In the soldering in the low temperature range, the lead-free soldering alloy having a low melting point is used. Such the soldering alloy include Sn-58Bi and Sn-52 In. The melting point of Sn-58Bi is about 140° C. That of Sn-52 In is about 120° C. During the soldering performed in the low temperature range, the peak temperature of the reflow oven is generally set to 150-160° C.

Incidentally, in a step-soldering where the soldering is performed in multiple stages, the soldering is expected to be performed at an intermediate temperature range between the above-mentioned intermediate temperature and low temperature. Examples of related arts related to the lead-free soldering alloy having the melting point in such the intermediate temperature range include JPH6-15476A. JPH6-15476A discloses a lead-free soldering alloy consisting of three elements of Sn, Ag and In. This conventional soldering alloy has a solidus temperature of 167-212° C. and a liquidus temperature of 179-213° C.

Examples of the related arts related to the present application include JP2013-198937A. JP2013-198937A discloses a lead-free soldering alloy consisting of Sn, In, Ag and Cu. JP2013-198937A discloses several examples in which these essential elements are different in content. Each of the solidus temperature of these examples is about 120° C.

Another example of the related art related to the present application includes JP2004-188453A. JP2004-188453A discloses a lead-free soldering alloy consisting of 0.5 to 5 mass % of Ag, 0.5 to 20 mass % of In, 0.1 to 3 mass % of Bi, 3 mass % or less of an additive element, and balance Sn. The additive element is at least one element selected from Sb, Zn, Ni, Ga, Ge and Cu. JP2004-188453A discloses examples of the alloys that contain 0.5 and 1.5 weight % of Ni as the additive element.

SUMMARY

The lead-free soldering alloy that simply has the low melting point is not suitable for a step-soldering including the soldering performed in the above-mentioned intermediate temperature range. That is, the property that melts at a temperature below the melting point of the low-temperature soldering alloy represented by Sn-58Bi leads to a possibility of being re-melted in the soldering step of the low-temperature soldering alloy. Therefore, the soldering alloy of JP2013-198937A having the solidus temperature lower than the melting point of the low-temperature soldering alloy cannot be subjected to the soldering step that is different from the soldering step of the said low-temperature soldering alloy.

In addition, the soldering alloy of JP2004-188453A has not been developed focusing on its melting point. Therefore, it is not known whether or not the soldering alloy of JP2004-188453A is suitable for the soldering performed in the above-mentioned intermediate temperature range.

It is important that the soldering alloy suitable for such the step-soldering not only meets the requirement on the melting point but also has excellent in a mechanical reliability. Therefore, there is room to develop the soldering alloy focusing on these viewpoints.

One object of the present disclosure is to provide a method for the step-soldering including the soldering performed in the intermediate to low temperature range.

A first example embodiment is a method for step-soldering and has the following features.

The method comprises the steps of:
applying a first solder alloy having a melting point in a temperature range from 160 to 210° C. to a jointed portion of a first electronic component and a substrate, and heating them in the temperature range from 160 to 210° C.; and
applying a second solder alloy having the melting point in a temperature range lower than 160° C. to a joint portion of a second electronic component and the substrate to which the first electronic component is joined, and heating them in the temperature range lower than 160° C.

The first solder alloy consists of 13-22 mass % of In, 0.5-2.8 mass % of Ag, 0.5-5.0 mass % of Bi, 0.002-0.05 mass % of Ni, optionally at least one selected from P, Ge and Ga in total of 0.09 mass % or less, optionally 0.005-0.1 mass % of Sb and a balance Sn.

A second example embodiment is a method for step-soldering and has the following features.

The method comprises the steps of:
applying a first solder alloy having a melting point in a temperature range over 210° C. to a jointed portion of a first electronic component and a substrate, and heating them in the temperature range over 210° C.; and
applying a second solder alloy having the melting point in a temperature range from 160 to 210° C. to a joint portion of a second electronic component and the substrate to which the first electronic component is joined, and heating them in the temperature range from 160 to 210° C.

The first solder alloy consists of 13-22 mass % of In, 0.5-2.8 mass % of Ag, 0.5-5.0 mass % of Bi, 0.002-0.05 mass % of Ni, optionally at least one selected from P, Ge and Ga in total of 0.09 mass % or less, optionally 0.005-0.1 mass % of Sb and a balance Sn.

DESCRIPTION OF EMBODIMENT

The present disclosure is described in detail below. In this specification, "%" of an element contained in a soldering alloy represents "mass %" unless otherwise specified. In addition, in this specification, the intermediate to low temperature range represents a temperature range from 160 to 210° C. An intermediate temperature range represents a temperature range above an upper limit of the intermediate to low temperature range (i.e., 210° C.). A low temperature range represents a temperature range below a lower limit of the intermediate to low temperature range (i.e., 160° C.). In addition, in this specification, a melting point represents a solidus temperature or a liquidus temperature.

1. Soldering Alloy

The soldering alloy according to the present disclosure includes an alloy composition consisting of 13-22% of In, 0.5-2.8% of Ag, 0.5-5.0% of Bi, 0.002-0.05% of Ni, and a balance Sn. Hereinafter, the elements constituting this alloy composition and their contents will be described.

1.1 In: 13-22%

Figure 1:
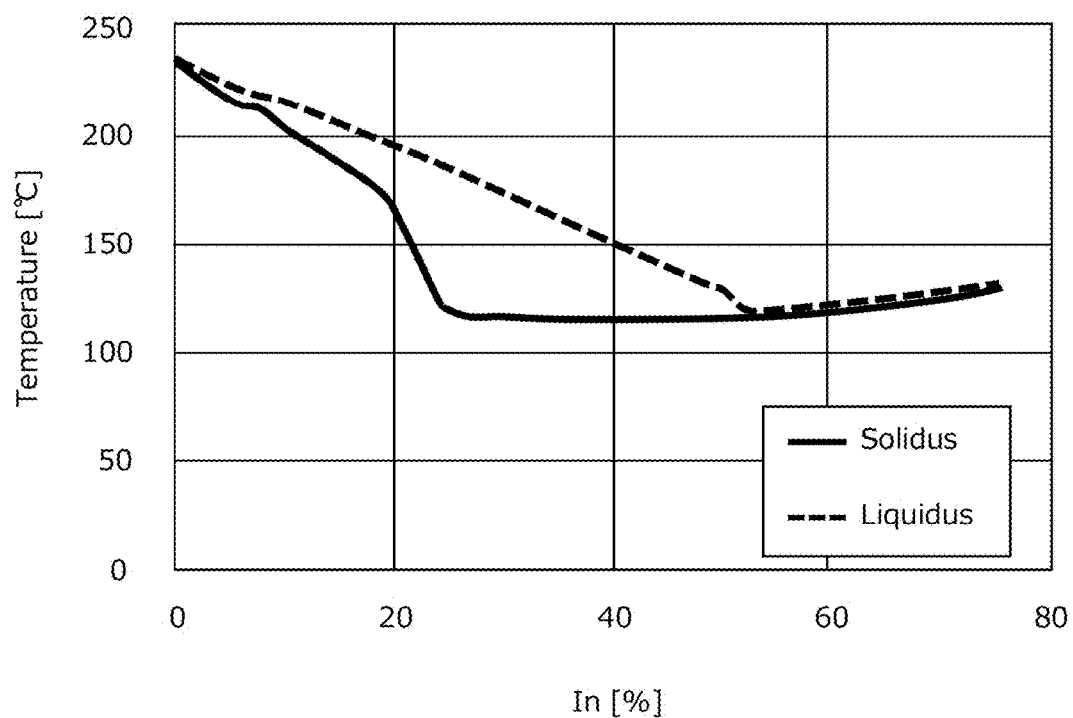
FIG. 1 is a diagram showing a relationship between a content of In in Sn—In based alloy and a melting point thereof.

In has a property of lowering the melting point of the soldering alloy. FIG. 1 is a graph showing a relationship between content of In in a Sn—In based alloy and the melting point thereof. As shown in FIG. 1, the melting point of the Sn—In based alloy tends to decrease as the content of In increases. However, when the content of In is more than 20%, the solidus temperature starts to decrease rapidly. When the content of In is greater than 25%, the solidus temperature drops to about 117° C. Therefore, the soldering alloy based on an alloy of which the content of In is more than 25% is not suitable as the soldering alloy for the soldering performed in the intermediate temperature range. In this respect, if an upper limit of the content of In is about 22%, the solidus temperature condition is satisfied. Therefore, this upper limit is 22%. From a viewpoint to satisfy the condition on the solidus temperature, a preferable upper limit is 21%, and a more preferable upper limit is 20%.

In the intermediate to low temperature range, the alloy of which the content of In is less than 5% forms a Sn-rich phase called a β-Sn phase. When the content of In is greater than 5%, the alloy forms a phase of $InSn_4$ compound called a γ phase. This γ phase is stably formed when the content of In is 5-25%. However, when the content of In decreases, there is a risk that a phase transformation occurs between the γ phase and the β-Sn phase in accompany with temperature change. When the phase transformation occurs, there is a risk that a mechanical reliability of the alloy will decrease because a deformation of the alloy will occur due to changes in volume. In this respect, when the lower limit of the content of In is 13%, this transformation can be suppressed. Therefore, this lower limit is 13%. From the viewpoint of the mechanical reliability, a preferable lower limit is 15%.

In addition, the γ phase has a brittle property as compared with SAC305. Therefore, if the content of In in the γ phase is increased, there is a risk that ductility of the soldering alloy may be lowered and the mechanical reliability of the soldering alloy may be lowered. Therefore, from the viewpoint to ensure the ductility, it is preferable that the upper limit of the content of In is not too large. A specific preferred upper limit is 17%.

1.2 Ag: 0.5-2.8%

Figure 2:
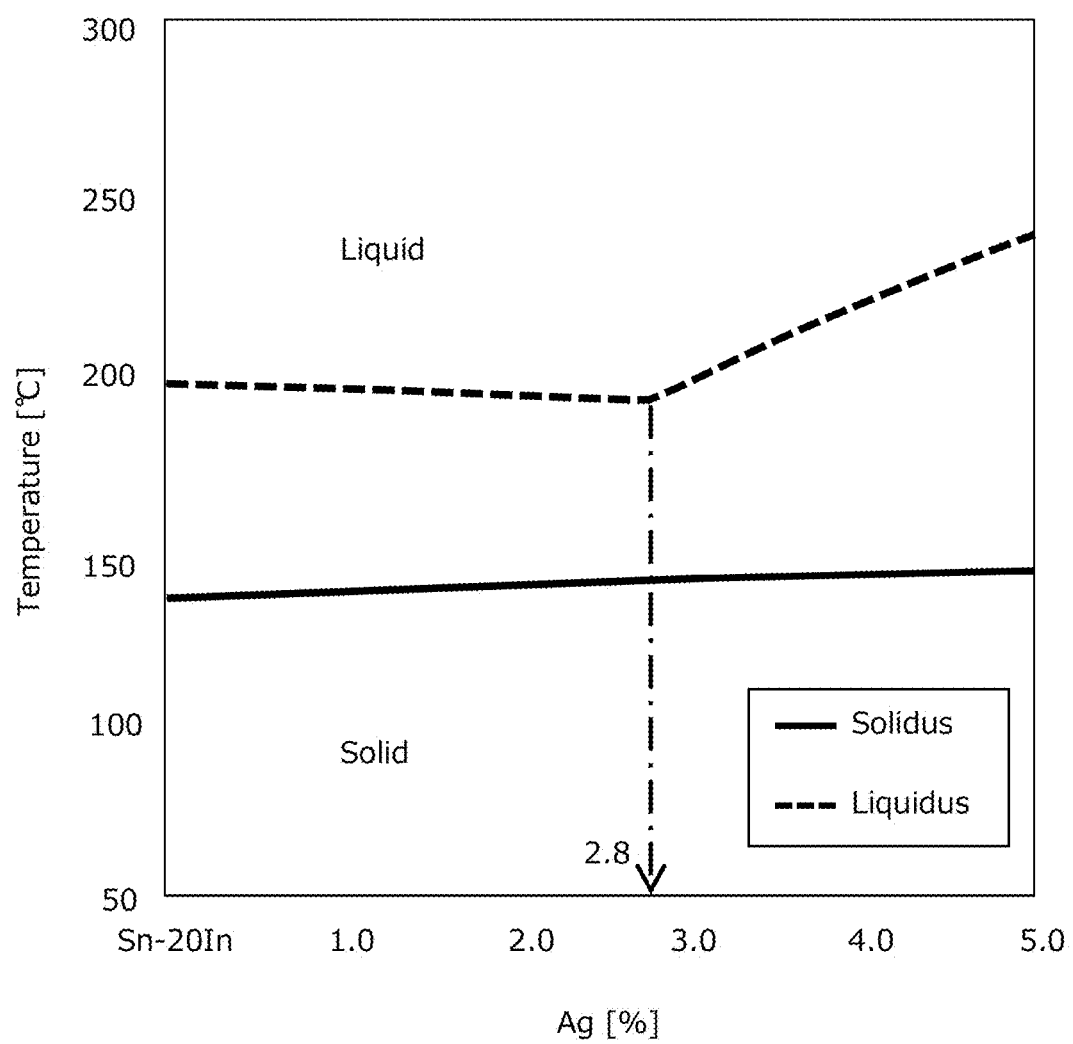
FIG. 2 is a diagram showing a relationship between a content of Ag in Sn-20 In—Ag based alloy and the melting point thereof.

Ag has a property of changing the melting point of the soldering alloy. FIG. 2 is a graph showing a relationship between the content of Ag in a Sn-20 In—Ag based alloy and the melting point thereof. As shown in FIG. 2, the liquidus temperature is located in the intermediate to low temperature range. When the content of Ag is 2.8% or less, this liquidus temperature tends to decrease as the content increases. When the content of Ag is greater than 2.8%, the liquidus temperature will start to rise. Therefore, when the content of Ag is more than 2.8%, it may prevent the melting point from decreasing due to the addition of In. Therefore, the upper limit of the content of Ag is 2.8%. From the viewpoint to suppress the increase in the liquidus temperature, the preferable upper limit is 2.5%.

Ag and In form a $Ag_2In$ compound. When the phase of this intermetallic compound is precipitated, the modification of the soldering alloy can be suppressed. From the viewpoint to exert this effect, the lower limit of the content of Ag is 0.5%. From the viewpoint to coarsen the precipitate and to enhance this effect, the preferable lower limit is 1.0%.

1.3 Bi: 0.5-5.0%

Figure 3:
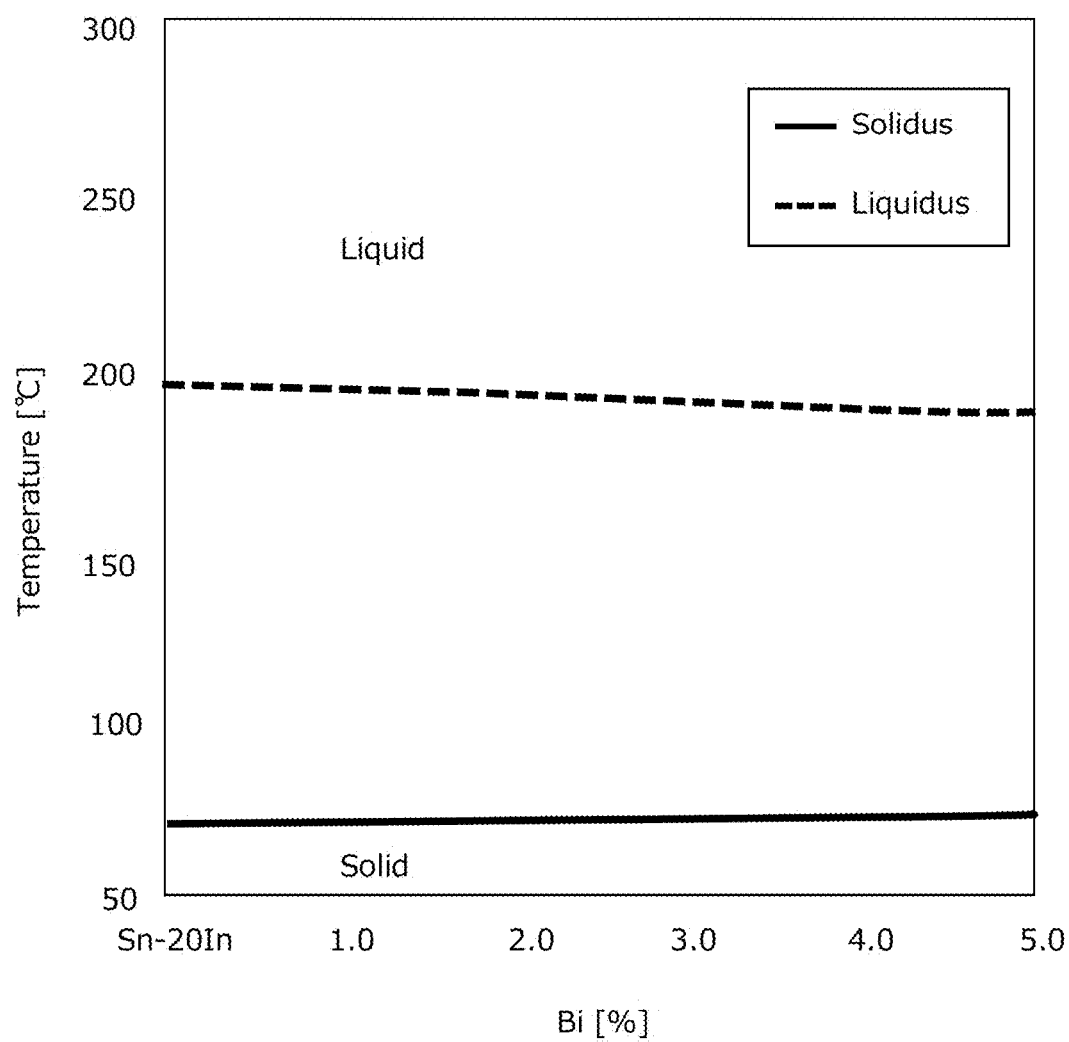
FIG. 3 is a diagram showing a relationship between a content of Bi in Sn-20 In—Bi based alloy and the melting point thereof.

Bi has a property of lowering the melting point of the soldering alloy. FIG. 3 is a graph showing a relationship between content of Bi in a Sn-20 In—Bi based alloy and the melting point thereof. As shown in FIG. 3, the liquidus temperature is located in the intermediate to low temperature range. This liquidus temperature tends to decrease as the content of Bi increases. However, it is not desirable that the melting point of the soldering alloy is too low due to the increase in the content of Bi. Therefore, the upper limit of the content of Bi is 5.0%. From the viewpoint to suppress the decrease in the liquidus temperature, the preferable upper limit is 2.5%.

Bi is dissolved in Sn in a certain amount. The solid solution of Bi makes it possible to suppress modification of soldering alloy. From the viewpoint to exert this effect, the lower limit of the content of Bi has been set to 0.5%. The preferable lower limit is 1.0% In addition, an excessive solid solution of Bi may reduce the ductility of the soldering alloy. From this viewpoint, it is preferable that the upper limit of the content of Bi is not too large. The specific preferred upper limit is 2.5%.

1.4 Ni

Ni has a property of fining an alloy organization. When the alloy organization is fined, the mechanical property of the soldering alloy is improved. From the viewpoint to exert this effect, the lower limit of the content of Ni has been set to 0.002%. The preferable lower limit is 0.003% and the more preferable lower limit is 0.004% On the other hand, an excessive miniaturization by Ni has a risk to lower the ductility of the soldering alloy. In addition, an excessive addition of Ni raise the liquidus temperature of the soldering alloy. From this viewpoint, it is desirable that the content of Ni is not too high. Therefore, the upper limit of the content of Ni is 0.05%. The preferable upper limit is 0.04% and the more preferable upper limit is 0.03%.

1.5 Sn: Balance

A balance of the soldering alloy of the present disclosure is composed of S n. Further, in addition to the essential elements described above, an unavoidable impurity may be contained in the soldering alloy Even if the unavoidable impurity is contained, it does not affect the effects due to the soldering alloy Examples of the unavoidable impurity include Pb and As.

1.6 Relationship in Content

In the soldering alloy according to the present disclosure, each content of In, Ag, Bi and Ni is as described above. However, from results of Examples described later, it is preferable that a relationship of these contents satisfies the following relationship (1).

$$0.9 \leq (In \times Ni) \times (Ag+Bi) \leq 3.4 \quad (1)$$

In the relationship (1), In, Ni, Ag, and Bi represent each content of the respective elements (mass %).

The soldering alloy of which the content of In, Ag, Bi and Ni is within the above described range and also satisfies the relationship (1) is preferred from the viewpoint of the melting point and the mechanical property. From the viewpoint of an intended melting point and mechanical property, an upper limit value of the relationship (1) is more preferably 2.55.

2. Other Additive Elements

In addition to the essential elements described above, the following element may be optionally contained in the soldering alloy according to the present disclosure. In this instance, Sn constitutes the balance of the soldering alloy to which the optional element has been added.

2.1 at Least One Selected from P, Ge and Ga: 0.09% or Less

P, Ge or Ga have properties of suppressing an oxidation of Sn and improving a wettability of the soldering alloy. Therefore, these elements are optionally added to the soldering alloy according to the present disclosure. In particular, when the soldering alloy according to the present disclosure is used as a preform solder, at least one selected from these elements is preferably added because it is possible to suppress a discoloration of a surface of the soldering alloy.

When the at least one selected from these elements is added, the upper limit of the content is 0.09% in total. When the total content exceeds 0.09%, a fluidity of the soldering alloy on the solder surface may be inhibited. Each content of the respective elements is not particularly limited. However, a preferable content of P is 0.005-0.06% and a more preferable content is 0.005-0.01%. The preferable content of Ge is 0.003-0.06% and the more preferable content is 0.003-0.01%. The preferable content of Ga is 0.005-0.06% and the more preferable content is 0.005-0.01%.

2.2 Sb: 0.005-0.1%

Likewise Ni, Sb has a property of fining the alloy organization. Therefore, Sb is optionally added to the soldering alloy according to the present disclosure When Sb is added, its content is 0.005-0.1%. When the content of Sb is less than 0.005%, the miniaturization effect is not exerted. When the content of Sb is more than 0.1%, the liquidus temperature of the soldering alloy is increased.

3. Melting Point of the Soldering Alloy

The melting point of the soldering alloy according to the present disclosure is not particularly limited as long as it is within the intermediate to low temperature range. However, the solidus temperature of the soldering alloy according to the present disclosure is preferably 160° C. or more. When the solidus temperature is above 160° C., the following effect is expected in the step-soldering including the soldering performed in the intermediate to low temperature range. That is, it is possible to prevent the soldering alloy according to the present disclosure which has been subjected to the soldering and has been soldered from being re-melted during the soldering performed for a low temperature soldering alloy. Examples of the low temperature soldering alloy include Sn-58Bi and Sn-52 In. The preferable solidus temperature is 165° C. or more.

Further, the liquidus temperature of the soldering alloy according to the present disclosure is preferably 210° C. or less. When the liquidus temperature is not exceed 210° C., the following effect is expected in the step-soldering including the soldering performed in the intermediate to low temperature range. That is, it is possible to prevent an intermediate or high temperature soldering alloy which has been soldered from being re-melted during the soldering performed for the soldering alloy according to the present disclosure. Examples of the medium temperature soldering alloy include SAC305. Examples of the high temperature soldering alloy include a soldering alloy of Sn-90Pb. The preferable liquidus temperature is 200° C. or less.

4. End-Usage of Soldering Alloy

4.1 Soldering Paste

The soldering alloy according to present disclosure is suitably used as a soldering paste. The soldering paste is produced by mixing a powdery soldering alloy with a flux containing a Rosin-based resin, an activator, a solvent, or the like. The flux is not particularly limited as long as it is commonly used in the art, and materials used therefor and blending ratio thereof are not particularly limited. The blending ratio (mass ratio) of the powdery soldering alloy and the flux is generally 90:10. However, this blending ratio is appropriately adjusted according to an end-usage of the soldering paste.

4.2 Preform Solder

The soldering alloy according to the present disclosure is also suitably used as a preform solder molded into a ribbon-shape, a disk-shape, a washer-shape, a tip-shape, or a ring-shape. The preform solder is produced by methods commonly known in the art. The shape of the preform solder is not limited to the above described shapes, and may be appropriately changed according to its end-usage. The preform solder may include the flux therein. The preform solder may be coated with the flux on its surface.

4.3 Soldering Ball

The soldering alloy according to the present disclosure is also suitably used as a soldering ball. The soldering ball is used to form a hemispherical bump in a semiconductor package such as ball-grid arrays (BGAs). The soldering ball is produced by methods commonly known in the art. When the soldering alloy according to the present disclosure is used as the soldering ball, its diameter is preferably in a range of 1-1000 μm. Further, a sphericity is preferably 0.90 or more, more preferably 0.95 or more, and most preferably 0.99 or more.

4.4 Wire Solder and Resin Flux Cored Solder

The soldering alloy according to the present disclosure is also suitably used as a wire solder processed into a wire. Further, the wire solder is also suitably used as a resin flux cored solder having the flux therein. The wire solder and resin flux cored solder are suitable for the soldering with a solder iron. The wire solder and resin flux cored solder are produced in a manner generally known in the art.

4.5 Solder Joint

The soldering alloy according to the present disclosure is also suitably used as a solder joint. The solder joint connects an electronic part such as an integrated circuit (IC) chip and a printed board (e.g., an interposer) in a semiconductor package. Alternatively, the solder joint joints to connect the semiconductor package and the printed circuit board. The solder joint is a connecting portion formed at a bonding portion. The solder joint is formed under common soldering conditions.

5. Electronic Circuit Board

When the soldering alloy according to the present disclosure functions as the solder joint, an electronic circuit board where an electronic part is joined via this solder joint corresponds to an electronic circuit board according to the present disclosure.

5.1 Single-Layer Electronic Circuit Board

Figure 4:
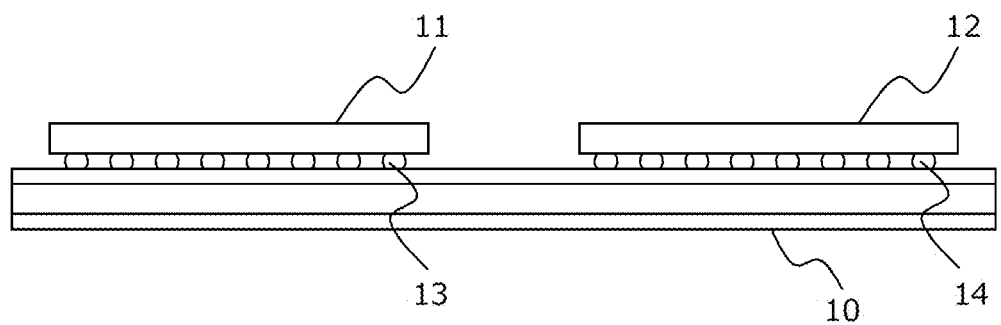
FIG. 4 is a schematic view showing a first example of an electronic circuit board.

FIG. 4 is a schematic diagram illustrating a first example of the electronic circuit board according to the present disclosure. A board 10 shown in FIG. 4 includes electronic parts 11 and 12. The board 10 is, for example, a printed-circuit board. The electronic parts 11 and 12 are, for example, IC chips. A maximum use temperature of the electronic part 11 is within the intermediate to low temperature range. The maximum use temperature of the electronic part 12 is above the lower limit of the intermediate temperature range (i.e., 210° C.). That is, a thermal resistance of the electronic part 12 is higher than that of the electronic part 11.

In the first example, the electronic part 11 is joined to the board 10 via a solder joint 13. The solder joint 13 is composed of the soldering alloy according to the present disclosure. On the other hand, the electronic part 12 is joined to the board 10 via a solder joint 14. The solder joint 14 is composed of the intermediate temperature soldering alloy or the high-temperature soldering alloy. That is, the solder joint 14 is composed of another soldering alloy having the melting point (more precisely, the solidus temperature) higher than the liquidus temperature of the soldering alloy according to the present disclosure.

Figure 5:
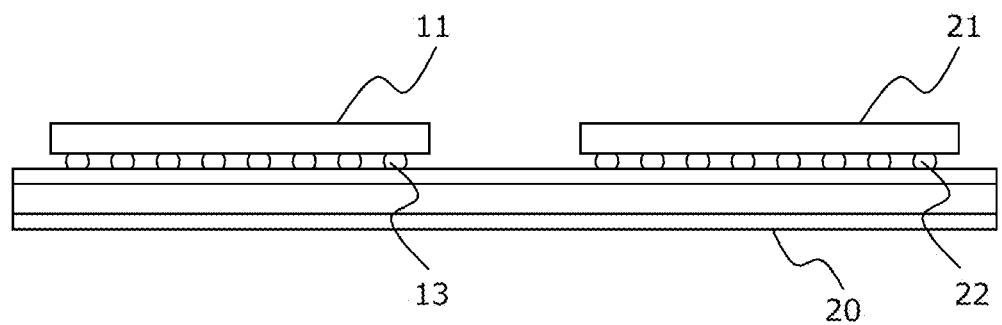
FIG. 5 is a schematic view showing a second example of the electronic circuit board.

FIG. 5 is a schematic diagram illustrating a second example of the electronic circuit board according to the present disclosure. Note that the electronic part 11 and the solder joint 13 shown in FIG. 5 are common to those shown in FIG. 4. Therefore, the descriptions for these elements are omitted. A board 20 shown in FIG. 5 includes an electronic part 21. The board 20 is, for example, a printed-circuit board. The electronic part 21 is, for example, an IC-chip. The maximum use temperature of the electronic part 21 is below the lower limit of the low temperature range (i.e., 160° C.). That is, the thermal resistance of the electronic part 21 is lower than that of the electronic part 11.

In the second example, the electronic part 21 is joined to the board 20 via a solder joint 22. The solder joint 22 is composed of a low temperature soldering alloy. That is, the solder joint 22 is composed of another soldering alloy having the melting point (more precisely, the liquidus temperature) lower than the solidus temperature of the soldering alloy according to the present disclosure.

5.2 Multi-Layer Electronic Circuit Board

Figure 6:
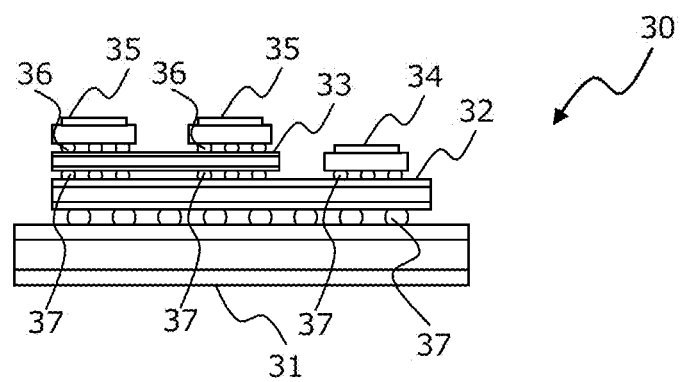
FIG. 6 is a schematic diagram showing a first example of a multi-layer electronic circuit board.

FIG. 6 is a schematic diagram illustrating a first example of a multi-layer electronic circuit board according to the present disclosure. A board 30 shown in FIG. 6 is a multi-layer board in which a board 32 and an interposer 33 are laminated on a board 31. The board 31 is, for example, a printed-circuit board. The board 32 is, for example, a packaging board. The board 32 includes an interposer 33 and an electronic part 34. In the present disclosure, the board 32 and the interposer 33 corresponds to a first board or a second board. The interposer 33 includes an electronic part 35.

The electronic parts 34 and 35 are, for example, integrated circuit chips. The maximum use temperature of the electronic part 34 is above the lower limit of the intermediate temperature range. The maximum use temperature of the electronic part 35 is within the intermediate to low temperature range. That is, the thermal resistance of the electronic part 34 is higher than that of the electronic part 35.

In the first example, the electronic part 35 is joined to the interposer 33 via a solder joint 36. The solder joint 36 is composed of the soldering alloy according to the present disclosure. On the other hand, the electronic part 34 is joined to the board 32 via a solder joint 37. The solder joint 37 is also used for a junction between the boards 31 and 32 and the junction between the board 32 and the interposer 33. The solder joint 37 is composed of the intermediate and high soldering alloy. That is, the solder joint 37 is composed of another soldering alloy having the melting point (more precisely, the solidus temperature) higher than liquidus temperature of the soldering alloy according to the present disclosure.

Figure 7:
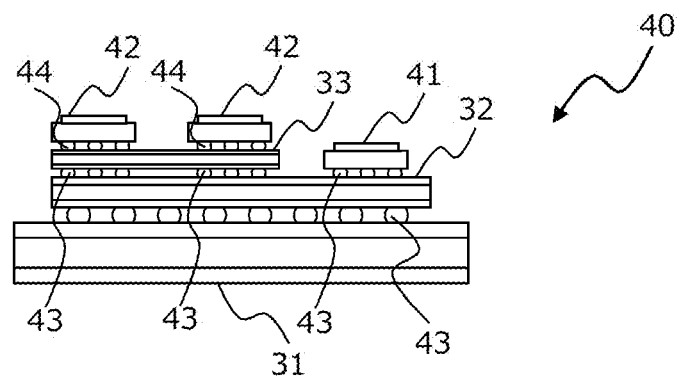
FIG. 7 is a schematic diagram showing a first example of a multi-layer electronic circuit board.

FIG. 7 is a schematic diagram illustrating a second example of the multi-layer electronic circuit board according to the present disclosure. Note that the boards 31 and 32 and the interposer 33 shown in FIG. 7 are common to those shown in FIG. 6. Therefore, the descriptions for these elements are omitted. A board 40 shown in FIG. 7 includes an electronic part 41. The interposer 33 includes an electronic part 42.

The electronic parts 41 and 42 are, for example, integrated circuit chips. The maximum use temperature of the electronic part 41 is within the intermediate to low temperature range. The maximum use temperature of the electronic part 42 is below the lower limit of the low temperature range. That is, the thermal resistance of the electronic part 42 is lower than that of the electronic part 41.

In the second example, the electronic part 41 is joined to the board 32 via a solder joint 43. The solder joint 43 is composed of the soldering alloy according to the present disclosure. The solder joint 43 is also used for the junction between the boards 31 and 32 and the junction between the board 32 and the interposer 33. On the other hand, the electronic part 42 is joined to the interposer 33 via a solder joint 44. The solder joint 44 is composed of the low-temperature soldering alloy. That is, the solder joint 44 is composed of another soldering alloy having the melting point (more precisely, the solidus temperature) lower than the liquidus temperature of the soldering alloy according to the present disclosure.

6. Others

In the step-soldering, the soldering by using a soldering alloy having a relatively higher melting point is performed earlier. The soldering by using a soldering alloy having a relatively lower melting point is performed later. The step-soldering is performed using, for example, a reflow method. In the reflow soldering, it is preferable to raise an ambient temperature to a temperature about 5 to 20° C. higher than the liquidus temperature of the soldering alloy to be subjected to the soldering. Then, it is preferred to cool the ambient temperature at 2-3° C./sec. By performing such the reflow soldering, the miniaturization of the alloy organization is enhanced. Other bonding conditions are appropriately adjusted according to the soldering alloy and properties of bonding objects.

7. EXAMPLES

A soldering alloy consisting of alloy composition shown in Table 1 was prepared and the melting point of soldering alloy was measured. The reliability of these soldering alloy was evaluated by a shear test with cryogenic cycles.

7.1 Melting Point

Solidus temperature and liquidus temperature were carried out by the same DSC (Differential scanning calorimetry) method as JISZ 3198-1 measuring method. Samples of which the solidus temperature are above 160° C. were evaluated as "GD", whereas those of which the solidus temperature are lower than 160° C. were evaluated as "PR". Samples with solidus temperature above 165° C. were evaluated as "EC". Samples with liquidus temperature below 210° C. were evaluated as "GD". Samples higher than 210° C. were evaluated as "PR". Samples with liquidus temperature below 200° C. were evaluated as "EC".

7.2 Shear Test with Cryogenic Cycles

Solder alloy was atomized to give a solder powder. Solder powder was mixed with fluxes to produce a soldering paste. This soldering paste was printed on a 0.8-mm-thick printed board (material: FR-4) using a 100-μm-thick metal mask. The BGA component was mounted on the print board using a mounter. Then, reflow soldering was performed at a maximum temperature of 200° C. for a holding time of 60 seconds to obtain board samples.

Board samples were placed in a heat cycle tester set at low temperature −40° C., high temperature +100° C., and holding time of 10 minutes and removed at 1000 cycles. Thereafter, this test board was measured for shear strength (N) by a shear strength measuring device (STR-1000 manufactured by RHESCA Co., Ltd.) under a condition of 6 mm/sec. Samples having a shear strength of 30.00N or more were evaluated as "GD" by determining that they are at a level which can be used without problems in practical use. Samples with a shear strength of less than 30.00N were evaluated as "PR". Samples for which the melting point was evaluated as "PR" were excluded from shear test.

The evaluation results are shown in Table 1, Table 2 and Table 3.

TABLE 1

|  | Sn | In | Ag | Bi | Ni | Other elements | (In*Ni)*(Ag + Bi) | Solidus | Liquidus | Shear test |
|---|---|---|---|---|---|---|---|---|---|---|
| Ex. 1 | Balance | 13 | 2.5 | 3 | 0.02 |  | 1.43 | EC | EC | GD |
| Ex. 2 | Balance | 15 | 2.5 | 2 | 0.02 |  | 1.35 | EC | EC | GD |
| Ex. 3 | Balance | 17 | 2.5 | 1.5 | 0.02 |  | 1.36 | EC | EC | GD |
| Ex. 4 | Balance | 20 | 1 | 1 | 0.05 |  | 2 | GD | EC | GD |
| Ex. 5 | Balance | 21 | 0.5 | 0.5 | 0.05 |  | 1.05 | GD | EC | GD |
| Ex. 6 | Balance | 17 | 0.5 | 1.5 | 0.02 |  | 0.68 | EC | EC | GD |
| Ex. 7 | Balance | 17 | 1 | 1.5 | 0.02 |  | 0.85 | EC | EC | GD |
| Ex. 8 | Balance | 17 | 2 | 1.5 | 0.02 |  | 1.19 | EC | EC | GD |
| Ex. 9 | Balance | 17 | 2.8 | 1.5 | 0.02 |  | 1.462 | EC | EC | GD |
| Ex. 10 | Balance | 18 | 1.5 | 0.5 | 0.04 |  | 1.44 | EC | EC | GD |
| Ex. 11 | Balance | 17 | 2.5 | 2 | 0.02 |  | 1.53 | EC | EC | GD |
| Ex. 12 | Balance | 14 | 1 | 5 | 0.03 |  | 2.52 | EC | EC | GD |
| Ex. 13 | Balance | 17 | 2.5 | 1.5 | 0 |  | 0.136 | EC | EC | GD |
| Ex. 14 | Balance | 17 | 2.5 | 1.5 | 0.01 |  | 0.34 | EC | EC | GD |
| Ex. 15 | Balance | 17 | 2.5 | 1.5 | 0.05 |  | 3.4 | EC | EC | GD |
| Ex. 16 | Balance | 17 | 2.5 | 1.5 | 0.02 | P: 0.005 | 1.36 | EC | EC | GD |
| Ex. 17 | Balance | 17 | 2.5 | 1.5 | 0.02 | Ge: 0.003 | 1.36 | EC | EC | GD |
| Ex. 18 | Balance | 17 | 2.5 | 1.5 | 0.02 | Ga: 0.005 | 1.36 | EC | EC | GD |
| Ex. 19 | Balance | 17 | 2.5 | 1.5 | 0.02 | P: 0.01 | 1.36 | EC | EC | GD |

TABLE 2

|  | Sn | In | Ag | Bi | Ni | Other elements | (In * Ni) * (Ag + Bi) | Solidus | Liquidus | Shear test |
|---|---|---|---|---|---|---|---|---|---|---|
| Ex. 20 | Balance | 17 | 2.5 | 155 | 0.02 | Ge: 0.01 | 1.36 | EC | EC | GD |
| Ex. 21 | Balance | 17 | 2.5 | 155 | 0.02 | Ga: 0.01 | 1.36 | EC | EC | GD |
| Ex. 22 | Balance | 17 | 2.5 | 155 | 0.02 | P: 0.005 Ge: 0.005 | 1.36 | EC | EC | GD |
| Ex. 23 | Balance | 17 | 2.5 | 155 | 0.02 | Sb: 0.005 | 1.36 | EC | EC | GD |
| Ex. 24 | Balance | 17 | 2.5 | 155 | 0.02 | Sb: 0.1 | 1.36 | EC | EC | GD |
| Ex. 25 | Balance | 15 | 2.5 | 155 | 0.02 |  | 1.36 | EC | EC | GD |
| Ex. 26 | Balance | 17 | 2.5 | 155 | 0.02 | P: 0.03 | 1.36 | EC | EC | GD |
| Ex. 27 | Balance | 17 | 2.5 | 155 | 0.02 | Ge: 0.03 | 1.36 | EC | EC | GD |
| Ex. 28 | Balance | 17 | 2.5 | 155 | 0.02 | Ga: 0.03 | 1.36 | EC | EC | GD |
| Ex. 29 | Balance | 17 | 2.5 | 155 | 0.02 | P: 0.06 | 1.36 | EC | EC | GD |
| Ex. 30 | Balance | 17 | 2.5 | 155 | 0.02 | Ge: 0.06 | 1.36 | EC | EC | GD |
| Ex. 31 | Balance | 17 | 2.5 | 155 | 0.02 | Ga: 0.06 | 1.36 | EC | EC | GD |
| Ex. 32 | Balance | 17 | 2.5 | 155 | 0.02 | P: 0.09 | 1.36 | EC | EC | GD |
| Ex. 33 | Balance | 17 | 2.5 | 155 | 0.02 | Ge: 0.09 | 1.36 | EC | EC | GD |
| Ex. 34 | Balance | 17 | 2.5 | 155 | 0.02 | Ga: 0.09 | 1.36 | EC | EC | GD |
| Ex. 35 | Balance | 17 | 2.5 | 155 | 0.02 | P: 0.04 Ge: 0.05 | 1.36 | EC | EC | GD |

TABLE 2-continued

|  | Sn | In | Ag | Bi | Ni | Other elements | (In * Ni) * (Ag + Bi) | Solidus | Liquidus | Shear test |
|---|---|---|---|---|---|---|---|---|---|---|
| Ex. 36 | Balance | 17 | 2.5 | 155 | 0.02 | Ge: 0.02 Ga: 0.03 | 1.36 | EC | EC | GD |
| Ex. 37 | Balance | 17 | 2.5 | 155 | 0.02 | P: 0.01 Ga: 0.01 | 1.36 | EC | EC | GD |

TABLE 3

|  | Sn | In | Ag | Bi | Ni | Other elements | (In*Ni)*(Ag + Bi) | Solidus | Liquidus | Shear test |
|---|---|---|---|---|---|---|---|---|---|---|
| Ref. 1 | Balance | 20 | 2.8 | | | | — | PR | EC | — |
| Ref. 2 | Balance | 15 | 2.5 | 2 | | | — | EC | EC | PR |
| Ref. 3 | Balance | 16 | 2.5 | 2 | | | — | EC | EC | PR |
| Ref. 4 | Balance | 17 | 2.5 | 1.5 | | | — | EC | EC | PR |
| Ref. 5 | Balance | 8 | 2 | 1.5 | 0.01 | | 0.28 | GD | PR | — |
| Ref. 6 | Balance | 25 | 2 | 1.5 | 0.01 | | 0.875 | PR | GD | — |
| Ref. 7 | Balance | 15 | 2 | 0.5 | 0.3 | | 15.75 | GD | PR | — |
| Ref. 8 | Balance | 8 | 3.5 | 0.5 | 0.5 | | 16 | GD | PR | — |
| Ref. 9 | Balance | 12 | 3.5 | 0.5 | 1.5 | | 72 | GD | PR | — |
| Ref. 10 | Balance | 12 | 2 | 2 | 1 | | 48 | GD | PR | — |
| Ref. 11 | Balance | 12 | 2.8 | 2 | 1 | | 57.6 | GD | PR | — |
| Ref. 12 | Balance | 12 | 2 | 1 | 2 | | 72 | GD | PR | — |
| Ref. 13 | Balance | 12 | 2.8 | 1 | 2 | | 91.2 | GD | PR | — |
| Ref. 14 | Balance | 18 | 2 | 2 | 1 | | 72 | GD | PR | — |
| Ref. 15 | Balance | 18 | 2.8 | 2 | 1 | | 86.4 | GD | PR | — |
| Ref. 16 | Balance | 18 | 2 | 1 | 2 | | 108 | GD | PR | — |
| Ref. 17 | Balance | 18 | 2.8 | 1 | 2 | | 136.8 | GD | PR | — |

From the results in the melting point of Examples 1-37, it was found that each of these examples satisfied the condition with respect to the melting point. Example 1 had the solidus temperature of 180° C. and the liquidus temperature of 196° C. Example 2 had the solidus temperature of 173° C. and the liquidus temperature of 195° C. Example 3 had the solidus temperature of 167° C. and the liquidus temperature of 191° C. These results prove that the intended melting point was realized by adding an appropriate amount of In, Ag and Bi having the property of lowering the melting point of Sn as a main component. From the shear test results, it was also found that these examples were excellent in the cold-heat cycling resistance. These results prove that the intended mechanical property was realized by adding an appropriate amount of Ag, Bi and Ni that improves the mechanical property.

The result in the melting point of Referential example 1 showed that the solidus temperature of Referential example 1 was 154° C., being lower than 160° C. This result indicates that the solidus temperature continues to decrease as the content of Ag increases.

The results in the melting point and the shear strength of Referential examples 2-4 indicate that these referential examples are inferior in the cold-cycle resistance, although their melting points are well evaluated. The results in the shear strength indicate that absence of Ni may have an effect.

The results in the melting point of Referential examples 5, 8-13 indicate that these referential examples had the liquidus temperature above 210° C. These results indicate that the liquidus temperature is not sufficiently lowered when In was added in a small amount. The results in the melting point of Referential example 8-13 indicate that the liquidus temperature may be increased when In was adding in a large amount. This possibility is supported by the fact that the results in the liquidus temperature of Referential examples 7, 14-17 and those of Referential examples 8-13 were the same.

The result in the melting point of Referential example 6 showed that the solidus temperature of Referential example 6 was 135° C. and it was found that the solidus temperature was lower than 160° C. This result indicates that the solidus temperature drops sharply when the added amount of In is higher than 25%.

7.3 Observation of Alloy Organization

To confirm the discussion in Referential examples 2-4, the soldering alloy of Examples 2 and 3 and the soldering alloys of Referential examples 2 and 4 were prepared. The soldering alloy of Referential example 2 has a composition obtained by removing Ni from that of Example 2. The soldering alloy of Referential example 4 has a composition obtained by removing Ni from that of Example 3.

Figure 8:
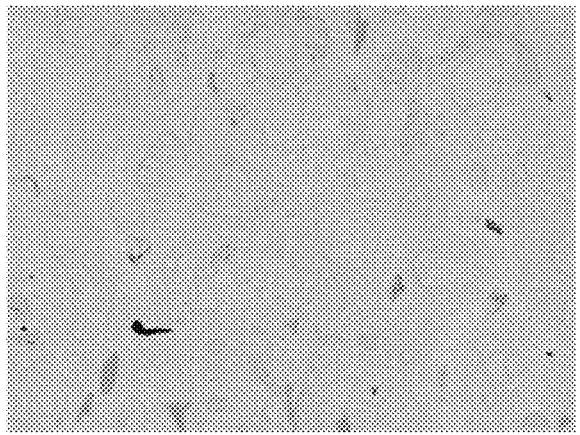
FIG. 8 is a diagram including cross-sectional SEM photographs of Example 2 and Referential example 2.
Figure 8:
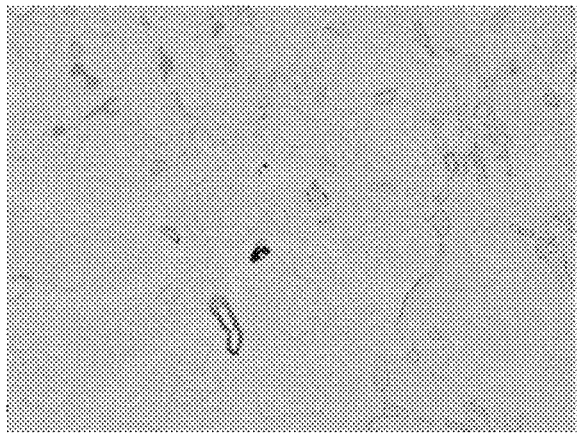
Figure 9:
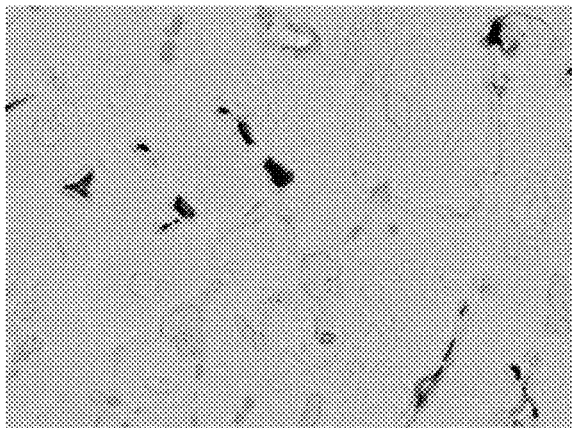
FIG. 9 is a diagram including cross-sectional SEM photographs of Example 3 and Referential example 4.
Figure 9:
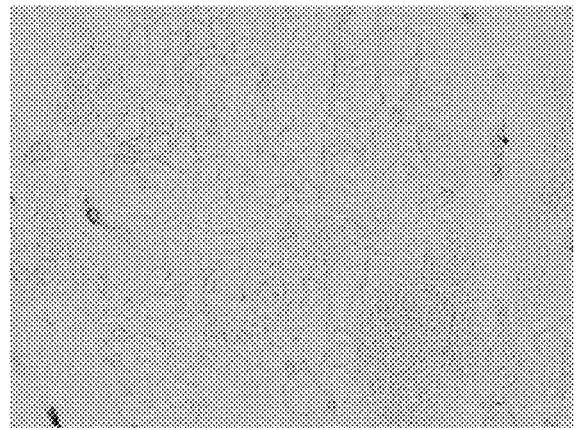

A resin mold was used to form these soldering alloys to obtain samples. Each of the samples was polished by about half, and the polished portion was photographed with a FE-SEM at a magnification of 1000 times. FIG. 8 is a cross-sectional SEM photography of Example 2 and Referential example 2. FIG. 9 is a cross-sectional SEM photography of Example 3 and Referential example 4. It was found from FIGS. 8 and 9 that the alloy organization of Example 2 or 3 in which Ni is included was fined as compared to that of the corresponding referential examples. This results indicate that the considerations discussed in Referential examples 2-4 may be reasonable. Note that the black portions shown in FIGS. 8 and 9 represent intermetallic compounds lost by the polishing.

Figure 10:
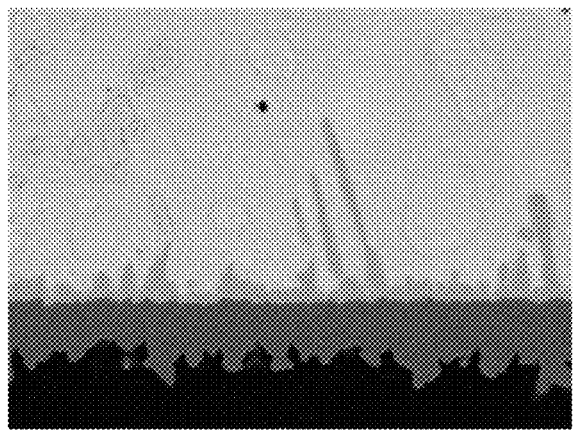
FIG. 10 is a diagram including cross-sectional SEM photographs of Example 2 and Referential example 2.
Figure 10:
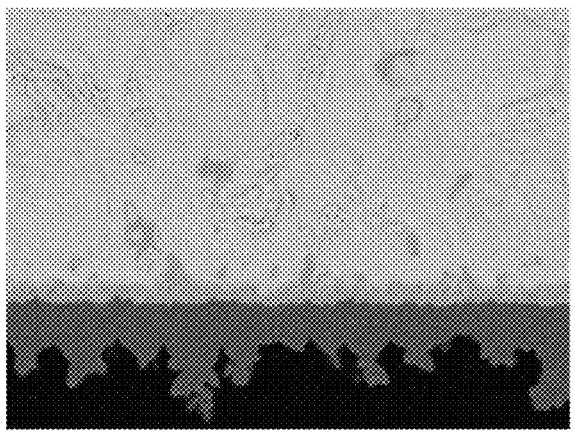
Figure 11:
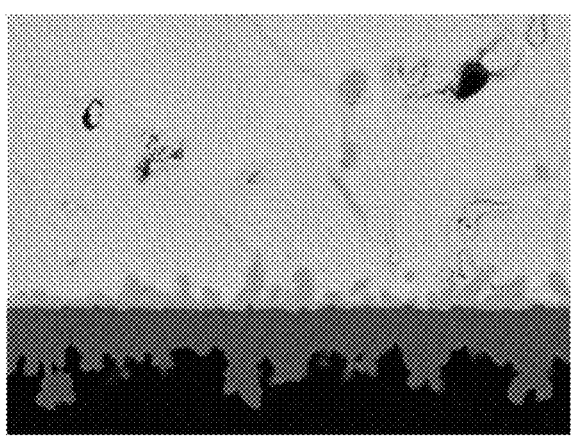
FIG. 11 is a diagram including cross-sectional SEM photographs of Example 3 and Referential example 4.
Figure 11:

In addition, the solder powders prepared from these soldering alloys was used to obtain board samples. The method for preparing the board samples was performed according to that in the shear test. Then, a bonding interface of the BGA terminal and the printed board was photographed with the FE-SEM at a magnification of 1000 times. FIG. 10 is a cross-sectional SEM photography of Example 2 and Referential example 2. FIG. 11 is a cross-sectional SEM photography of Example 3 and Referential example 4. It was found from FIGS. 11 and 12 that the miniaturization of the alloy organization in Example 2 or 3 were maintained even in a state of the BGA terminal. The results indicate that soldering alloy according to present disclosure may be useful as the BGA terminal and the solder joint.

What is claimed is:

1. A method for step-soldering, the method comprising:

applying a first solder alloy having a melting point in a temperature range from 160 to 210° C. to a jointed portion of a first electronic component and a substrate, and heating them in the temperature range from 160 to 210° C.; and applying a second solder alloy having the melting point in a temperature range lower than 160° C. to a joint portion of a second electronic component and the substrate to which the first electronic component is joined, and heating them in the temperature range lower than 160° C., wherein, the heating of the temperature range from 160 to 210° C., the first solder alloy, the first electronic component and the substrate is heated 5 to 20° C. higher than a liquidus temperature of the first solder alloy, wherein, in the heating of the temperature range lower than 160° C., the second solder alloy, the second electronic component and the substrate is heated 5 to 20° C. higher than a liquidus temperature of the second solder alloy, wherein the method further comprising cooling at 2-3° C./sec the first solder alloy, the first electronic component and the substrate after the heating of the temperature range from 160 to 210° C. and before the heating of the temperature range lower than 160° C., and wherein the first solder alloy consists of 13-22 mass % of In, 0.5-2.8 mass % of Ag, 0.5-5.0 mass % of Bi, 0.002-0.05 mass % of Ni, optionally at least one selected from P, Ge and Ga in total of 0.09 mass % or less, optionally 0.005-0.1 mass % of Sb and a balance Sn.

2. The method according to claim 1, wherein the content of In of the first solder alloy is 15-20%.

3. The method according to claim 2, wherein an upper limit of the content of In of the first solder alloy is 17%.

4. The method according to claim 1, wherein the content of Ag of the first solder alloy is 1.0-2.5%.

5. The method according to claim 1, wherein the content of Bi of the first solder alloy is 1.0-2.5%.

6. The method according to claim 1, wherein the content of Ni of the first solder alloy is 0.003-0.04%.

7. The method according to claim 1, wherein the content of In, Ag, Bi, and Ni of the first solder alloy satisfies the following relationship (1), $$0.9 \leq (In \times Ni) \times (Ag+Bi) \leq 3.4 \quad (1)$$

wherein, in the relationship (1), In, Ni, Ag, and Bi represent each content of the respective elements.

8. The method according to claim 1, wherein the melting point of the first solder alloy is 165° C. or higher and 200° C. or lower.

9. The method according to claim 1, wherein a thermal resistance of the second electronic component is lower than that of the first electronic component.

* * * * *